(12) United States Patent
Hsieh et al.

(10) Patent No.: US 12,500,213 B2
(45) Date of Patent: Dec. 16, 2025

(54) LIGHT-EMITTING DEVICE AND DISPLAY DEVICE

(71) Applicants: EPISTAR CORPORATION, Hsinchu (TW); Yenrich Technology Corporation, Hsinchu (TW)

(72) Inventors: Min-Hsun Hsieh, Hsinchu (TW); Hsin-Mao Liu, Hsinchu (TW); Tzu-Hsiang Wang, Hsinchu (TW); Ya-Wen Lin, Hsinchu (TW); Chi-Chih Pu, Hsinchu (TW); Hsiao-Pei Chiu, Hsinchu (TW); Ching-Tai Cheng, Hsinchu (TW); Chong-Yu Wang, Hsinchu (TW)

(73) Assignees: Epistar Corporation, Hsinchu (TW); Yenrich Technology Corporation, Hsinchu (TW)

( * ) Notice: Subject to any disclaimer, the term of this patent is extended or adjusted under 35 U.S.C. 154(b) by 478 days.

(21) Appl. No.: 18/082,199

(22) Filed: Dec. 15, 2022

(65) Prior Publication Data
US 2023/0207540 A1    Jun. 29, 2023

(30) Foreign Application Priority Data
Dec. 29, 2021   (TW) ................................ 110149443

(51) Int. Cl.
| | | |
|---|---|---|
| *H01L 25/13* | (2006.01) | |
| *G09F 9/33* | (2006.01) | |
| *H01L 25/075* | (2006.01) | |
| *H10H 20/819* | (2025.01) | |
| *H10H 20/83* | (2025.01) | |
| *H10H 20/84* | (2025.01) | |
| *H10H 20/85* | (2025.01) | |

(Continued)

(52) U.S. Cl.
CPC .......... *H01L 25/13* (2013.01); *H01L 25/0753* (2013.01); *H10H 20/853* (2025.01); *H10H 20/855* (2025.01); *H10H 20/857* (2025.01)

(58) Field of Classification Search
CPC ... H01L 25/0753; H01L 25/13; H10H 20/819; H10H 20/854; H10H 20/857; H10H 29/142
See application file for complete search history.

(56) References Cited

U.S. PATENT DOCUMENTS

2019/0019780 A1* 1/2019 Kim ................... H01L 25/0753
2020/0058834 A1* 2/2020 Park ...................... H10D 86/60
(Continued)

*Primary Examiner* — Antonio B Crite
(74) *Attorney, Agent, or Firm* — Patterson + Sheridan, LLP

(57) ABSTRACT

A light-emitting device includes a circuit carrier board having a short side and a long side, a plurality of light-emitting units on the circuit carrier board for emitting three or more color lights, and a light-transmitting glue layer on the circuit carrier board and covering the plurality of light-emitting units. The short side is shorter than the long side. The plurality of light-emitting units include a first light-emitting unit. The first light-emitting unit has a light exit surface, a first sidewall, and a second sidewall. The first sidewall faces the short side and has a first included angle with the light exit surface, and the second sidewall faces the long side and has a second included angle with the light exit surface. The first included angle is between 85 to 95 degrees, and the second included angle is less than 85 degrees or greater than 105 degrees.

19 Claims, 8 Drawing Sheets

(51) Int. Cl.
 _H10H 20/853_ (2025.01)
 _H10H 20/854_ (2025.01)
 _H10H 20/855_ (2025.01)
 _H10H 20/857_ (2025.01)
 _H10H 29/14_ (2025.01)

(56) References Cited

U.S. PATENT DOCUMENTS

| | | | |
|---|---|---|---|
| 2022/0199594 A1* | 6/2022 | Shin | H01L 25/0753 |
| 2022/0199856 A1* | 6/2022 | Kim | H10H 20/854 |
| 2023/0102042 A1* | 3/2023 | Liao | H10H 29/142 |
| | | | 257/79 |
| 2023/0128693 A1* | 4/2023 | Hu | H10H 20/817 |
| | | | 257/89 |
| 2023/0132292 A1* | 4/2023 | Yan | H10H 20/01 |
| | | | 438/4 |
| 2023/0327058 A1* | 10/2023 | Ohashi | H05B 33/12 |

* cited by examiner

1000

LIGHT-EMITTING DEVICE AND DISPLAY DEVICE

CROSS REFERENCE TO RELATED APPLICATIONS

This Application claims priority of Taiwan Patent Application No. 110149443, filed on Dec. 29, 2021, the entirety of which is incorporated by reference herein.

BACKGROUND

Technical Field

The present disclosure relates to a light-emitting element of a display device, and, in particular, to a light-emitting element of a pixel of the display device.

Description of the Related Art

Light-emitting diode (LED) has the characteristics of low power consumption, low heat generation, long operating life, high impact resistance, small size, and fast response speed, thereby being widely used in various fields that require using light-emitting elements, such as vehicles, home appliances, display screens, and lighting fixtures. In particular, LED is a kind of monochromatic light. When LED is used as a pixel in a display, excellent contrast and color saturation may be obtained. However, there are still some issues to be solved with the current LED display. For example, the red, blue, and green LED chips have different light patterns and/or light-emitting angles. When the red, blue, and green LED chips are used as the sub-pixels of the display, the color mixed by the sub-pixels varies with the viewing angle.

SUMMARY

An embodiment of the present disclosure provides a light-emitting device including a circuit carrier board having a short side and a long side, a plurality of light-emitting units on the circuit carrier board for emitting three or more color lights, and a light-transmitting glue layer on the circuit carrier board and covering the plurality of light-emitting units. The short side is shorter than the long side. The plurality of light-emitting units includes a first light-emitting unit. The first light-emitting unit has a light exit surface, a first sidewall, and a second sidewall. The first sidewall faces the short side and has a first included angle with the light exit surface, and the second sidewall faces the long side and has a second included angle with the light exit surface. The first included angle is between 85 to 95 degrees, and the second included angle is less than 85 degrees or greater than 105 degrees.

DETAILED DESCRIPTION

Figure 1:
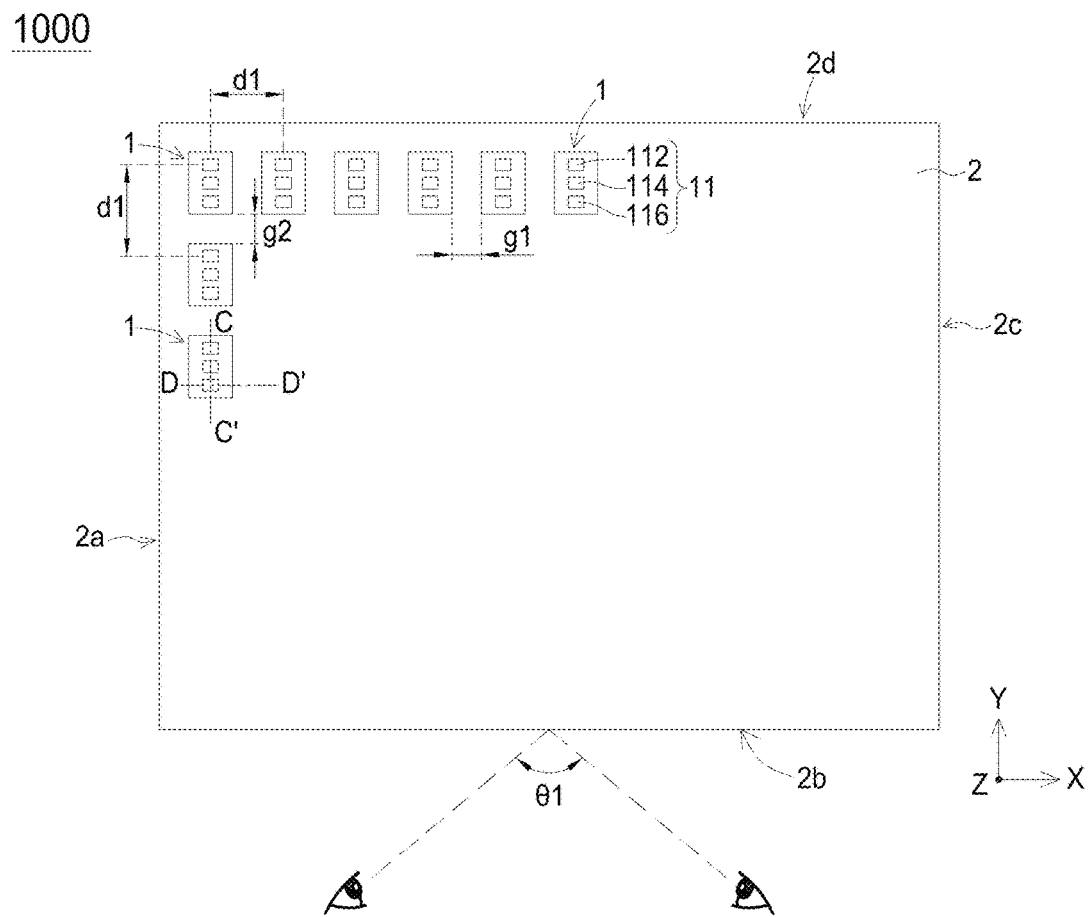
FIG. 1 is a schematic diagram of a display module in accordance with an embodiment.

FIG. 1 shows a display module 1000. The display module 1000 includes a target substrate 2 and a plurality of light-emitting devices 1 arranged on the target substrate 2 in the form of an array. Each of the light-emitting devices 1 includes one light-emitting element group 11. One light-emitting element group 11 includes at least three light-emitting units, for example, a first light-emitting unit 112, a second light-emitting unit 114, and a third light-emitting unit 116. The first light-emitting unit 112, the second light-emitting unit 114, and the third light-emitting unit 116 may be independently controlled to emit the same or different color lights. If the color lights emitted by the light-emitting element group 11 includes three primary colors (i.e., red light, blue light, and green light), the light-emitting element group 11 may serve as one display pixel in the display module 1000. The plurality of light-emitting devices 1 is arranged in the form of a matrix and fixed on the target substrate 2, and the arrangement method includes arranging the light-emitting devices 1 one by one on the target substrate 2, or arranging the plurality of light-emitting devices 1 on the target substrate 2 at one time. On the X-axis (horizontal direction), in two adjacent light-emitting element groups 11, the horizontal distances between two adjacent light-emitting units 112, two adjacent light-emitting units 114, and two adjacent light-emitting units 116 (the horizontal distance between centerlines of two adjacent light-emitting units) are all d1. On the Y-axis (longitudinal direction), in two adjacent light-emitting element groups 11, the vertical distances between two adjacent light-emitting units 112, two adjacent light-emitting units 114, and two adjacent light-emitting units 116 (the vertical distance between centerlines of two adjacent light-emitting units) are also all d1. The distance d1 is determined according to the size of the target substrate 2 and the resolution of the display module 1000. On the X-axis, there is a spacing distance g1 between two adjacent light-emitting devices 1 (the horizontal distance between adjacent boundaries of two adjacent light-emitting devices). On the Y-axis, there is a spacing distance g2 between two adjacent light-emitting devices 1 (the vertical distance between adjacent boundaries of two adjacent light-emitting devices). In an embodiment, the spacing distance g1 and the spacing distance g2 are respectively between κ μm and 1000 μm. The greater spacing distances g1 and g2 are helpful for replacing the faulty light-emitting device 1 in the subsequent processes.

Figure 2:
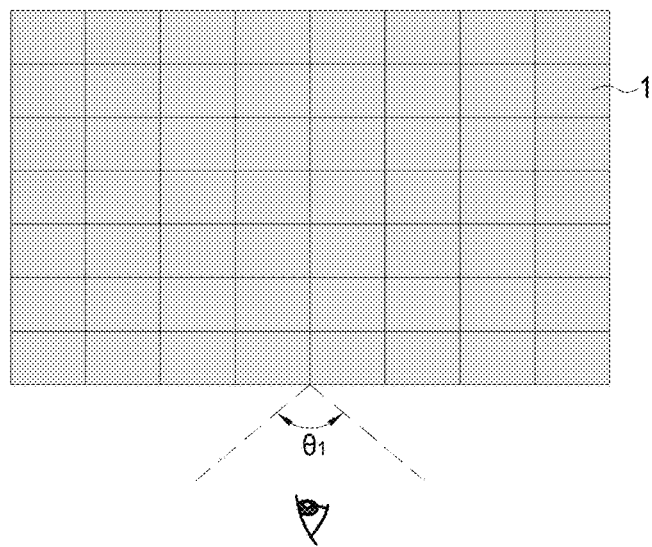
FIG. 2 is a schematic diagram of color distribution of a screen seen by a viewer right in front of a display module.
Figure 3:
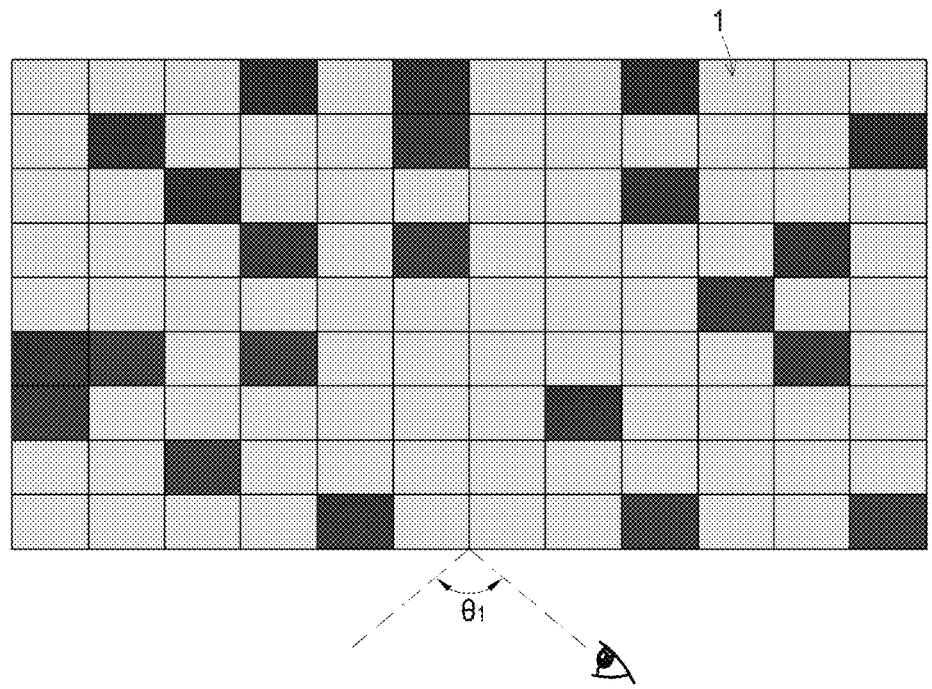
FIG. 3 is a schematic diagram of non-uniform color distribution of a display screen of a display module caused by a difference in light-emitting angles of light-emitting units.
Figure 4:
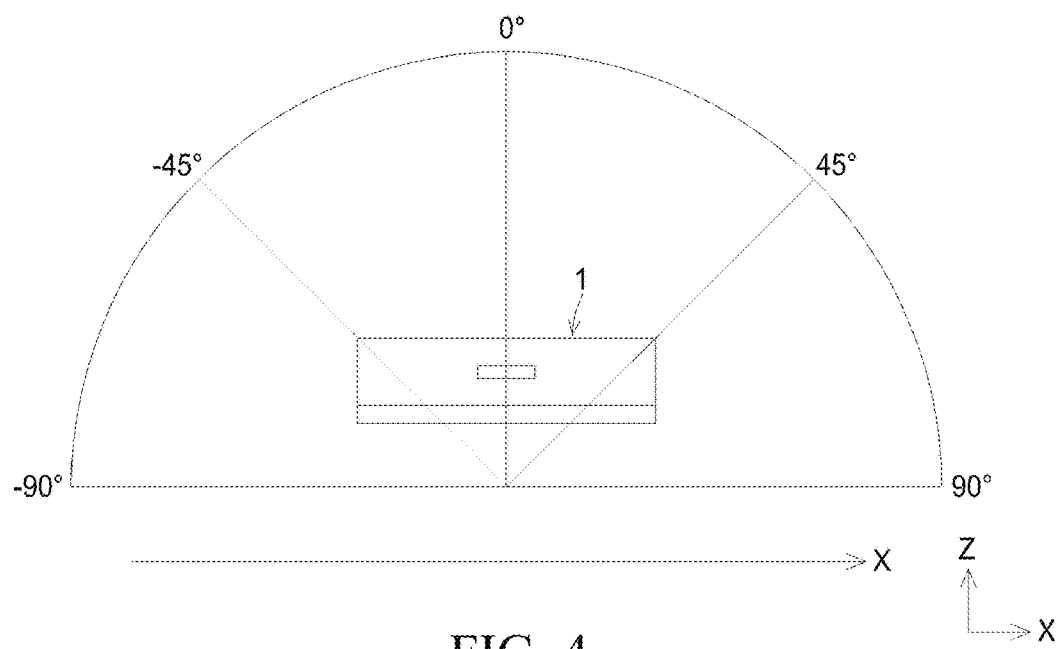
FIG. 4 shows a measuring method for a light-emitting intensity of a light-emitting device.
Figure 5:
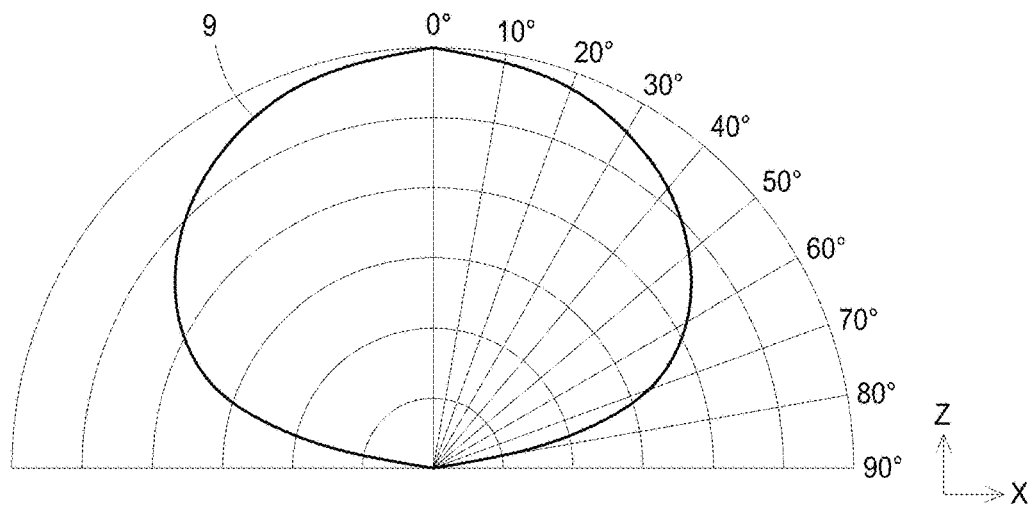
FIG. 5 shows an ideal light pattern of a light-emitting device in accordance with an embodiment.

As shown in FIG. 1, under normal usage conditions, a viewer will change the viewing position within a viewing angle θ1 on the X-axis (horizontal direction) of the display module 1000. Therefore, the ratio of light-emitting intensity between the red light, blue light, and green light should be as consistent as possible within the viewing angle θ1 range to ensure that the color difference between each light-emitting element group 11 is minimized within the viewing angle θ1. FIGS. 2 and 3 illustrate an influence caused by the difference between the light-emitting angles of the light-emitting units in the light-emitting element group 11. As shown in FIG. 2, if the display module 1000 displays a single color (e.g., red, blue, or green), the viewer may see a picture with uniform colors right in front of the display module 1000. As shown in FIG. 3, when the viewer changes the viewing angle to another specific angle and the color difference of the light emitted by two adjacent light-emitting element groups 11 at the specific angle is too large, the viewer can see dots patterns scattered randomly with non-uniform color depths. This case is usually referred to as mura. In order to reduce the occurrence of mura on the display module 1000, the light-emitting unit 112, the light-emitting unit 114, and the light-emitting unit 116 of the light-emitting element group 11 of each light-emitting device 1 are preferably close to each other on the X-axis direction or within the specific viewing angle. The measurement method of the light-emitting pattern on the X-axis direction is shown in FIG. 4. On the XZ plane, the light intensities of the light-emitting unit 112, the light-emitting unit 114, and the light-emitting unit 116 are measured between −90 degrees and 90 degrees with the light-emitting device 1 as the center. As shown in FIG. 5, when the light emission pattern of the light-emitting unit 112, the light-emitting unit 114, or the light-emitting unit 116 of the light-emitting element group 11 is approximately elliptical on the XZ plane and the maximum light-emitting intensities are at positions of about 0±10 degrees in the polar coordinates, the light emission pattern is called a preferred light pattern 9. If each of the light-emitting units 112, the light-emitting units 114, and the light-emitting units 116 on the display module 1000 have similar light patterns, for example, the preferred light pattern 9, the mura may be reduced.

Figure 6A:
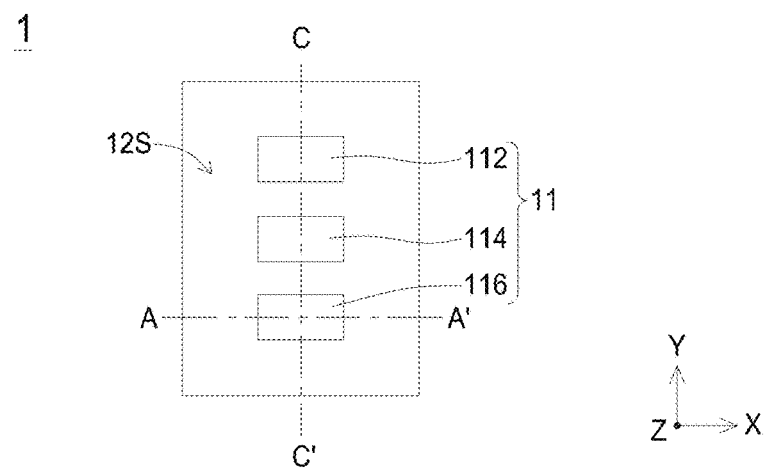
FIG. 6A shows a top view of a light-emitting device in accordance with an embodiment.
Figure 6B:
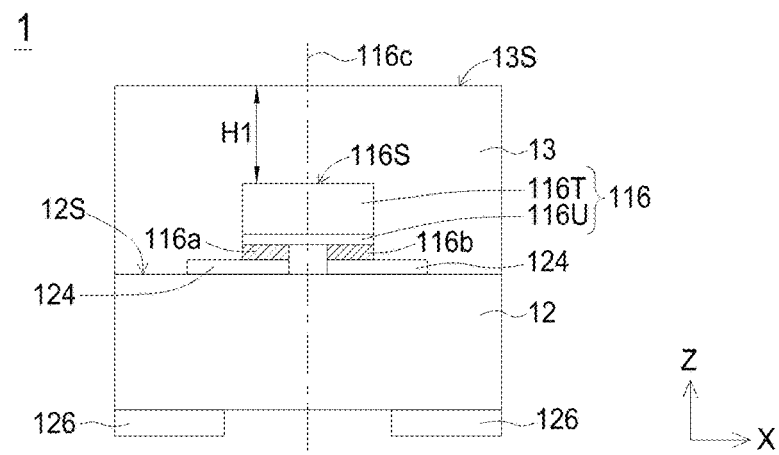
FIG. 6B is a cross-sectional schematic diagram of a light-emitting device in FIG. 6A.

FIG. 6A is a top view of a light-emitting device 1 according to an embodiment, and FIG. 6B is a cross-sectional schematic diagram of the light-emitting device 1 along the line AA' in FIG. 6A. In practice, although the materials of the light-emitting unit 112, the light-emitting unit 114, and the light-emitting unit 116 are not exactly the same, their structures are substantially similar. For example, the materials and/or structures of the blue and green light-emitting units are generally similar, but the material of the red light-emitting unit is generally different from the material of the blue/green light-emitting unit. For the sake of brevity, only the cross-sectional schematic diagram of the light-emitting unit 116 is taken as an example to describe a connection structure between the light-emitting units 112, 114, 116 and a circuit carrier board 12. As shown in FIG. 6B, the light-emitting device 1 includes the circuit carrier board 12, the light-emitting unit 116 on the circuit carrier board 12, and a light-transmitting element 13 on the circuit carrier board 12. The light-transmitting element 13 covers the light-emitting unit 116 and a surface 12S of the circuit carrier board 12.

As shown in FIG. 6B, the carrier board 12 is a circuit board, for example, an ABF (Ajinomoto Build-up Film) carrier board, a BT (Bismaleimide Triazine) carrier board, and an HDI carrier board, etc. The carrier board 12 has an upper electrode 124 on the surface 12S and a lower electrode 126 on the other side opposite the surface 12S. The upper electrode 124 electrically connects the light-emitting units 116 in the light-emitting element group 11, and the lower electrode 126 electrically connects to the target substrate 2 for fixing the light-emitting device 1 on the target substrate 2.

As shown in FIG. 6A, the light-emitting element group 11 includes the light-emitting unit 112, the light-emitting unit 114, and the light-emitting unit 116. In this embodiment, the number of the light-emitting units is three, but the disclosure is not limited thereto. In another embodiment, the number of the light-emitting units may be four or more. For example, there are four light-emitting units in one light-emitting element group 11, which emit red light, blue light, green light, and cyan light, respectively. In an embodiment, the light-emitting unit 112, the light-emitting unit 114, and the light-emitting unit 116 are LED dies and/or LED packages that may emit light of different wavelengths or different colors, respectively. In an embodiment, the light-emitting unit 112 is a red light-emitting diode die that may be driven by a power through a power source for emitting a first light. The dominant wavelength and/or the peak wavelength of the first light are between 600 nm and 660 nm. The light-emitting unit 114 is a green light-emitting diode die that may emit a second light. The dominant wavelength and/or the peak wavelength of the second light are between 510 nm and 560 nm. The light-emitting unit 116 is a blue light-emitting diode die that may emit a third light. The dominant wavelength and/or a peak wavelength are between 430 nm and 480 nm. The light-emitting diode die as the light-emitting unit 112, the light-emitting unit 114, or the light-emitting unit 116 may be a vertical light-emitting diode die, a horizontal light-emitting diode die, or a flip chip light-emitting diode die. As shown in FIG. 6B, the light-emitting unit 116 has a p-electrode 116a and an n-electrode 116b, both of which are electrically connected to the upper electrodes 124 for introducing current into the light-emitting unit 116 to emit light, where the material to connect the p-electrode 116a and the n-electrode 116b to the upper electrodes 124 includes solder metal, such as solder paste and conductive glue. The conductive glue includes anisotropic conductive glue, resin conductive glue, etc. The material of the light-transmitting element 13 includes silicone, epoxy resin, ceramics, glass, or a combination of the above materials, and the material has greater than 80% transmittance for wavelengths from 440 nm to 470 nm, 510 nm to 540 nm, and 610 nm to 640 nm.

As shown in FIG. 6B, in an embodiment, the light-transmitting element 13 has an upper surface 13S that is parallel or substantially parallel to the surface 12S of the carrier board 12. That is, the light-transmitting element 13 has a constant thickness on the surface 12S of the carrier board 12. The light-emitting unit 116 has an upper surface 116S, and the thickness H1 between the upper surface 13S of the light-transmitting element 13 and the upper surface 116S of the light-emitting unit 116 is between 1 μm and 500 μm. In another embodiment, the thickness H1 is between 50 μm and 150 μm.

Figure 7:
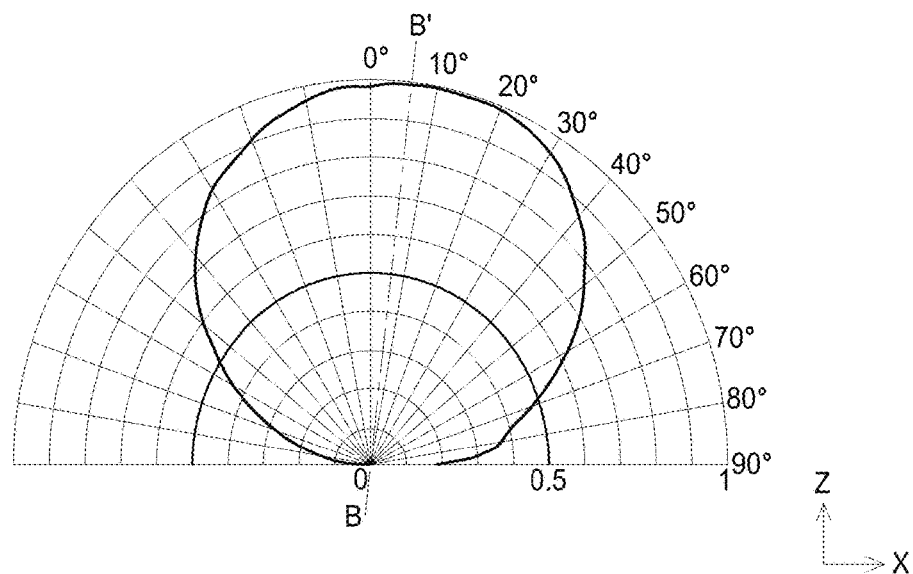
FIG. 7 shows an actual light pattern of the light-emitting unit in FIG. 6A.

FIG. 7 shows a light pattern of a light-emitting unit 116. In the embodiment, the thickness H1 is 100 µm, and the light-emitting unit 116 is a flip-chip blue light-emitting diode die with an emission wavelength ranging from 440 nm to 470 nm. Among the light pattern measured by the experiment, the maximum light-emitting intensity is between 0 degrees and 10 degrees, and the light pattern is approximately elliptical. The light pattern has similar shapes on left and right sides of the connecting line BB' between the emitting center and the maximum light-emitting intensity. Specifically, the light pattern is substantially mirror-symmetrical with respect to the connecting line BB'.

Figure 8:
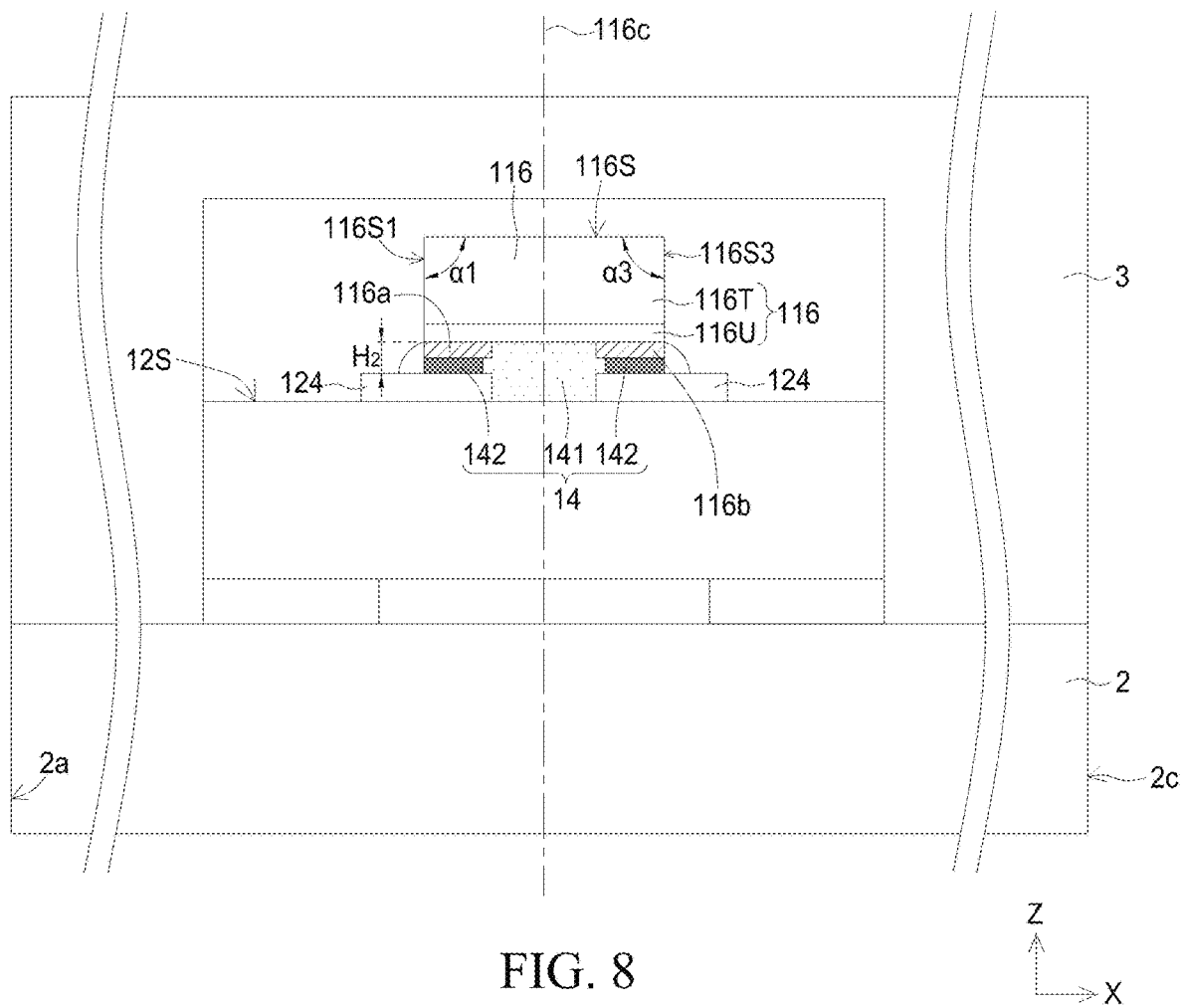
FIG. 8 is a cross-sectional schematic diagram of a light-emitting device 1 along a line DD' in FIG. 1.
Figure 9:
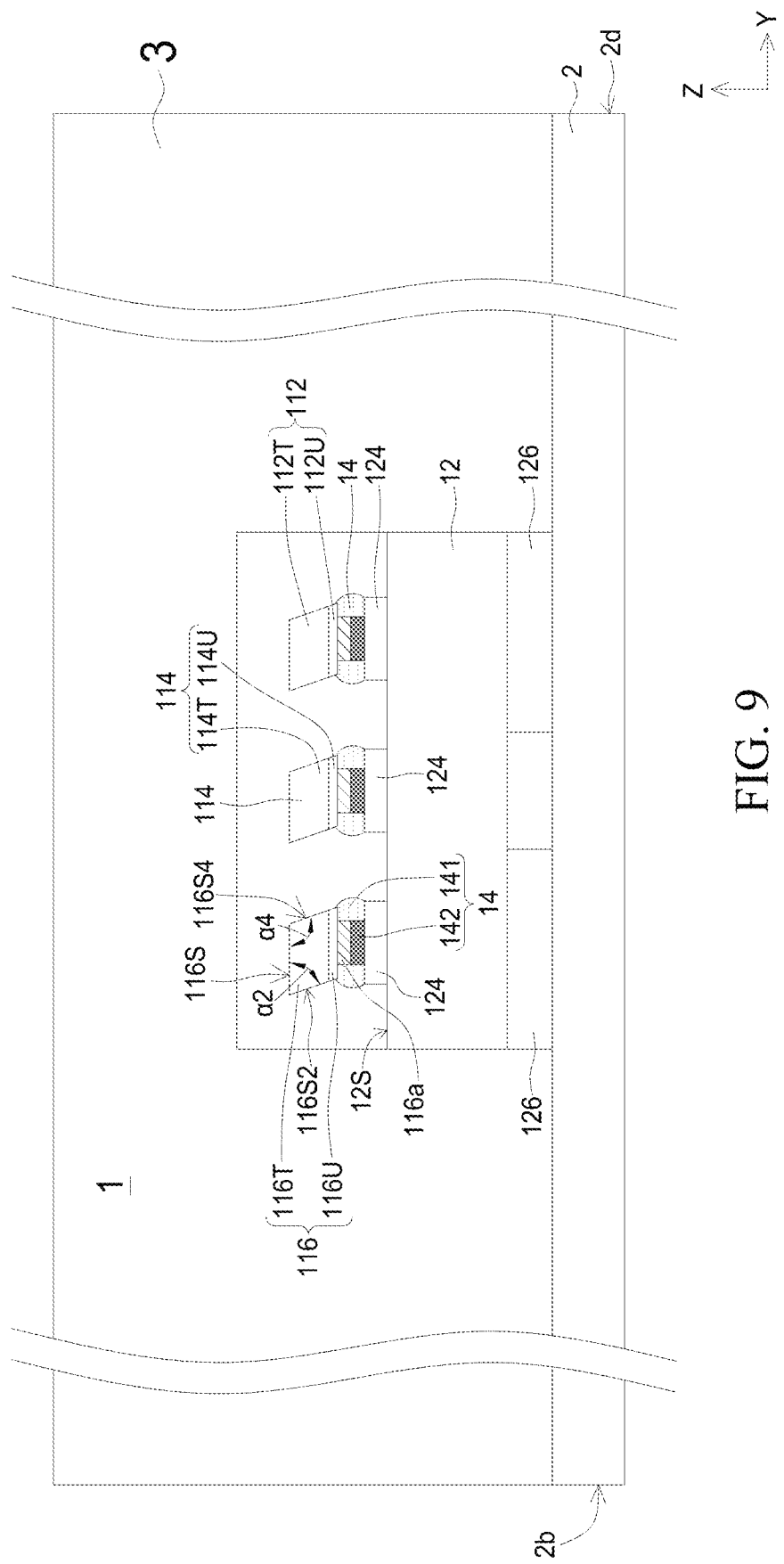
FIG. 9 is a cross-sectional schematic diagram of the light-emitting device 1 along a line CC' in FIG. 1 in accordance with an embodiment.

FIG. 8 is a cross-sectional schematic diagram of a light-emitting device 1 along a line DD' in FIG. 1, and FIG. 9 is a cross-sectional schematic diagram of a light-emitting device 1 along a line CC' in FIG. 1. In an embodiment, the light-emitting units 112, 114, and 116 are flip-chips. Each of the light-emitting units 112, 114, and 116 includes semiconductor stacks 112U, 114U, and 116U, respectively, and includes sapphire substrates 112T, 114T, and 116T, respectively. The sapphire substrates 112T, 114T, and 116T are above the semiconductor stacks 112U, 114U, and 116U with a thickness between 10 µm and 200 µm, respectively. Therefore, the lights emitted by the light-emitting units 112, 114, and 116 must pass through the sapphire substrate to be emitted outward. As mentioned above, since the structures of the light-emitting units 112, 114 and 116 are the same or similar, the cross-sectional schematic diagram of the light-emitting unit 116 is taken as an example in this embodiment for the subsequent description. As shown in FIGS. 8 and 9, the sapphire substrate 116T of the light-emitting unit 116 has an upper surface 116S and four side surfaces 116S1 to 116S4 between the upper surface 116S, the p-electrode 116a, and the n-electrode 116b.

As shown in FIG. 9, if the sapphire substrate is cleaved and then obliquely cracks along the R plane of the lattice plane of the sapphire substrate, the angle between the side surface 116S2 and the upper surface 116S of the sapphire substrate 116T in the light-emitting unit 116 is $\alpha_2$, and the angle between the side surface 116S2 and the upper surface 116S of the sapphire substrate 116T in the light-emitting unit 116 is $\alpha_4$. The $\alpha_2$ is less than 85 degrees, the $\alpha_4$ is greater than 105 degrees, and the absolute value of the difference between $\alpha_2$ and $\alpha_4$ ($|\alpha_4-\alpha_2|$) is about 20 degrees. As shown in FIG. 8, if the side surfaces 116S1 and 116S3 do not obliquely crack, the angle $\alpha_1$ between the side surface 116S1 and the upper surface 116S and the angle $\alpha_3$ between the side surface 116S3 and the upper surface 116S are between 85 and 95 degrees. The absolute value of the difference between $\alpha_1$ and $\alpha_3$ ($|\alpha_1-\alpha_3|$) is less than 10 degrees. In other words, the side surfaces 116S1 and 116S3 without oblique cracks are closer to a vertical plane (compared to the upper surface 116S) than the side surfaces 116S2 and 116S4 with oblique cracks. For example, $\alpha_1$ is greater than $\alpha_2$, and $\alpha_3$ is smaller than $\alpha_4$. Alternatively, $|\alpha_1-90|<|\alpha_2-90|$, and $|\alpha_3-90|<|\alpha_4-90|$.

Since the side surfaces 116S1 and 116S3 without oblique cracks are closer to a vertical plane than the side surfaces 116S2 and 116S4 with oblique cracks, in view of a central axis 116c of the light-emitting unit 116, the cross-sectional shape of the sapphire substrate 116T of the light-emitting unit 116 in the XZ plane is more symmetrical than the cross-sectional shape of the sapphire substrate 116T of the light-emitting unit 116 in the YZ plane. The more symmetrical shape of the sapphire substrate may generate a light pattern more similar to an ellipse, so the light pattern of the light-emitting unit 116 on the XZ plane is more similar to an ellipse than the light pattern on the YZ plane. As shown in FIG. 1, the target substrate 2 of the display module 1000 has four sides 2a, 2b, 2c, and 2d, wherein the side 2a is opposite to the side 2c, and the side 2b is opposite to the side 2d. The resolution specifications of the standardized electronic display devices are that the width is greater than the height, such as Full HD (1920×1080), 4K UHD (3840×2160), and 8K Ultra HD (7680×4320). Therefore, the appearance of the display module 1000 usually designed as a rectangle. If the lengths of the sides 2a and 2c of the target substrate 2 are shorter than the lengths of the sides 2b and 2d, the short sides 2a and 2c are on the left and right sides of the viewer when an image is played to the viewer. In order to reduce the occurrence of mura on the display module 1000, the light patterns of the light-emitting unit 112, the light-emitting unit 114 and the light-emitting unit 116 of the light-emitting element group 11 must be as symmetrical as possible along the central axis of the light-emitting units. Taking the light-emitting unit 116 as an example, as shown in FIGS. 6B and 8, the light pattern of the light-emitting unit 116 along the direction of the central axis 116c must be as symmetrical as possible. Therefore, in the light-emitting unit 116, the side surfaces 116S1 and 116S3 that have no oblique cracks or are more vertical preferably face the short sides 2a and 2c, while the side surfaces 116S2 and 116S4 that have oblique cracks or are less vertical preferably face the long sides 2b and 2d. Since the light-emitting units 112 and 114 have similar structures to the light-emitting unit 116, in the light-emitting units 112 and 114, the side surfaces that have no oblique cracks or are more vertical face the short sides 2a and 2c, and the side surfaces that have oblique cracks or are less vertical face the long sides 2b and 2d.

Figure 10:
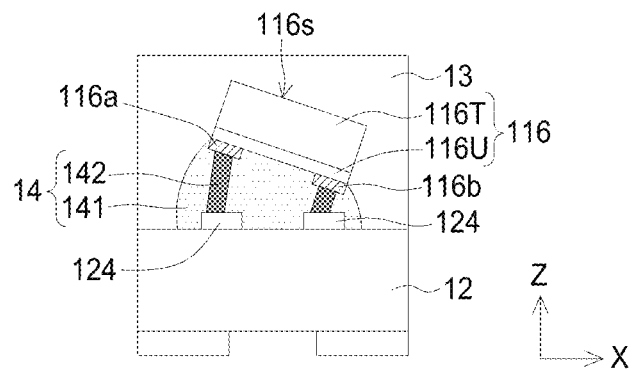
FIG. 10 is a schematic diagram of the light-emitting unit 116 obliquely affixed on a circuit carrier board 12 in accordance with an embodiment.

In an embodiment, as shown in FIGS. 8 and 9, the light-emitting units 112, 114, and 116 are electrically connected to the upper electrodes 124 on the circuit carrier board 12 through the conductive glue 14. Since the structures of the light-emitting elements 112, 114, and 116 are the same or similar, the structure of the light-emitting unit 116 will be described hereinafter. The conductive glue 14 includes an insulating portion 141 and a plurality of conductive portions 142 while two conductive portions 142 are not in contact with each other. The conductive portions 142 are connected to the electrodes 116a and 116b and the upper electrodes 124. The insulating portion 141 surrounds the conductive portions 142 to ensure adjacent conductive portions 142 be completely isolated to each other. The material of the insulating portion 141 includes silicone, epoxy resin, or a mixture thereof. The conductive portion 142 includes metal, such as tin, gold, silver, copper, and the like. In an embodiment, the uncured conductive glue 14 is a liquid glue that contains metal particles. The process of applying the conductive glue 14 includes coating the liquid glue on the upper electrode 124; then placing the light-emitting units 112, 114, and 116 on the liquid glue; and, finally, performing a reflowing process for the metal particles to agglomerate between the upper electrodes 124 and the two conductive portions 142 respectively to form two conductive portions 116a and 116b, and the insulating parts 141 are cured. If there is too much liquid glue coated on the upper electrode 124, the light-emitting units 112, 114, and 116 are likely to be tilted. After the reflowing process is completed, the light-emitting units 112, 114 and 116 are tilted and fixed on the circuit carrier board 12. As shown in FIG. 10, the light-emitting unit 116 is tilted and fixed on the circuit carrier board 12. Now the maximum light-emitting intensity of the light-emitting unit 116 may not be between −10 degrees and 10 degrees in the polar coordinates of the light pattern, and the light pattern may not be symmetrical.

As described above, in order to prevent the light-emitting units 112, 114, and 116 from being tilted on the circuit carrier board 12, the amount of the liquid glue must be properly controlled in the process of coating the liquid glue on the upper electrode 124. As shown in FIG. 8, if the thickness H2 of the cured conductive glue 14 is controlled within 5 µm, the surface 116S of the light-emitting unit 116 is easier to keep parallel with the surface 12S of the circuit carrier board. The maximum light-emitting intensity of the light-emitting unit 116 is also easier to be between −10 degrees and 10 degrees in the polar coordinates of the light pattern, so as to obtain an approximately elliptical light pattern.

Figure 11:
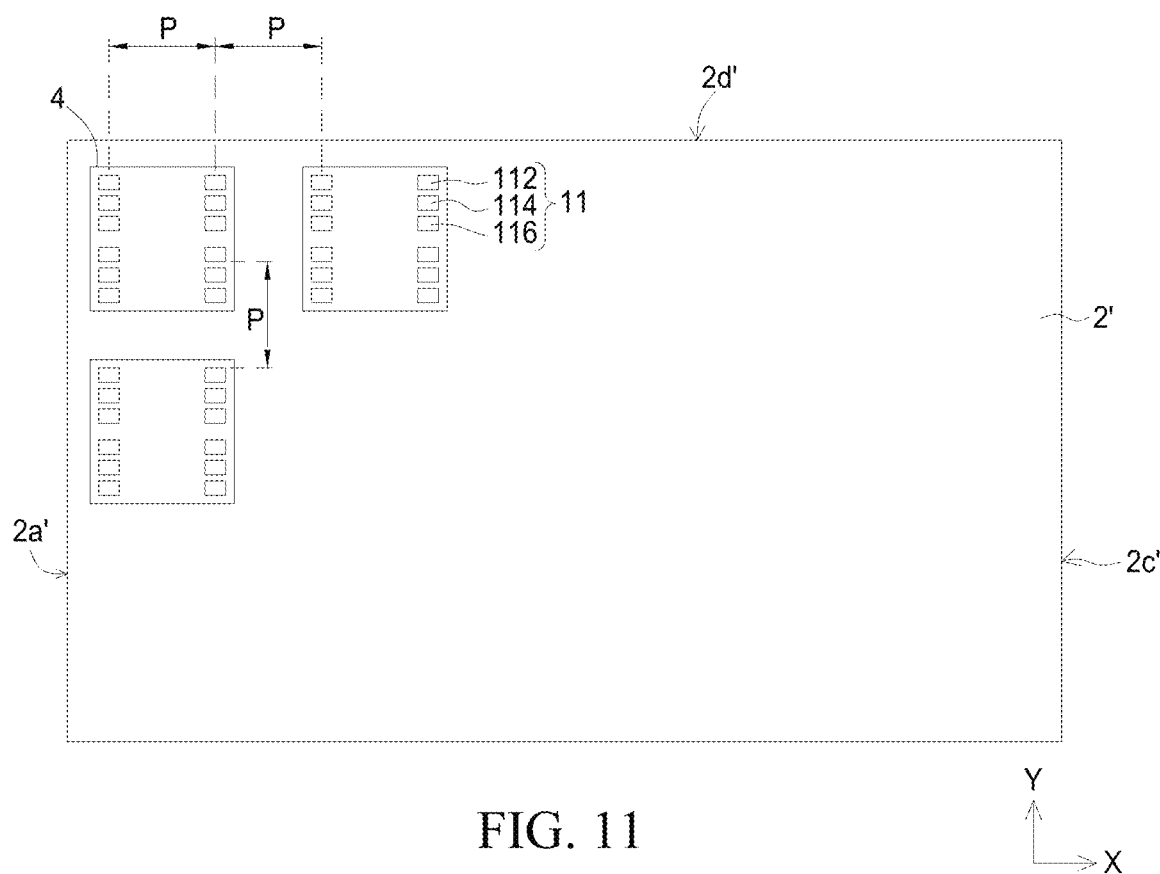
FIG. 11 is a schematic diagram of a display module 2000 in accordance with an embodiment.

FIG. 11 is a schematic diagram of a display module 2000 according to an embodiment. The display module 2000 includes a target substrate 2' and a plurality of light-emitting devices 4 arranged on the target substrate 2' in the form of an array. The target substrate 2' has the same function and similar structure as the target substrate 2 shown in FIG. 1. The difference between the light-emitting device 4 and the light-emitting device 1 shown in FIG. 1 is that the light-emitting device 4 has a plurality of light-emitting element groups 11. In an embodiment, one light-emitting device 4 has four or more light-emitting element groups 11, wherein the light-emitting units 112, 114, and 116 in each light-emitting element group 11 may emit red light, blue light, and green light, respectively, and may serve as one display pixel in the display module 2000. The light-emitting devices 4 in the display module 2000 are arranged in the form of a matrix and fixed on the target substrate 2'. Along the X-axis and the Y-axis, the distance P between two adjacent same-color light-emitting units in one light-emitting device 4 is the same with the distance P between two adjacent same-color light-emitting units in two adjacent light-emitting devices 4.

Figure 12A:
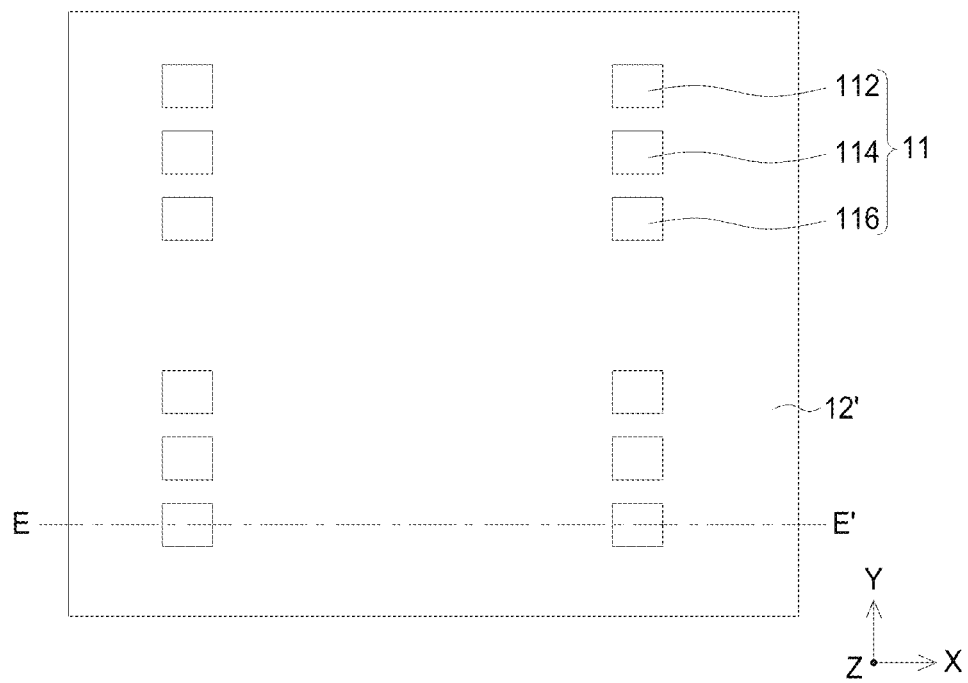
FIG. 12A shows a top view of a light-emitting device 4 in accordance with an embodiment.
Figure 12B:
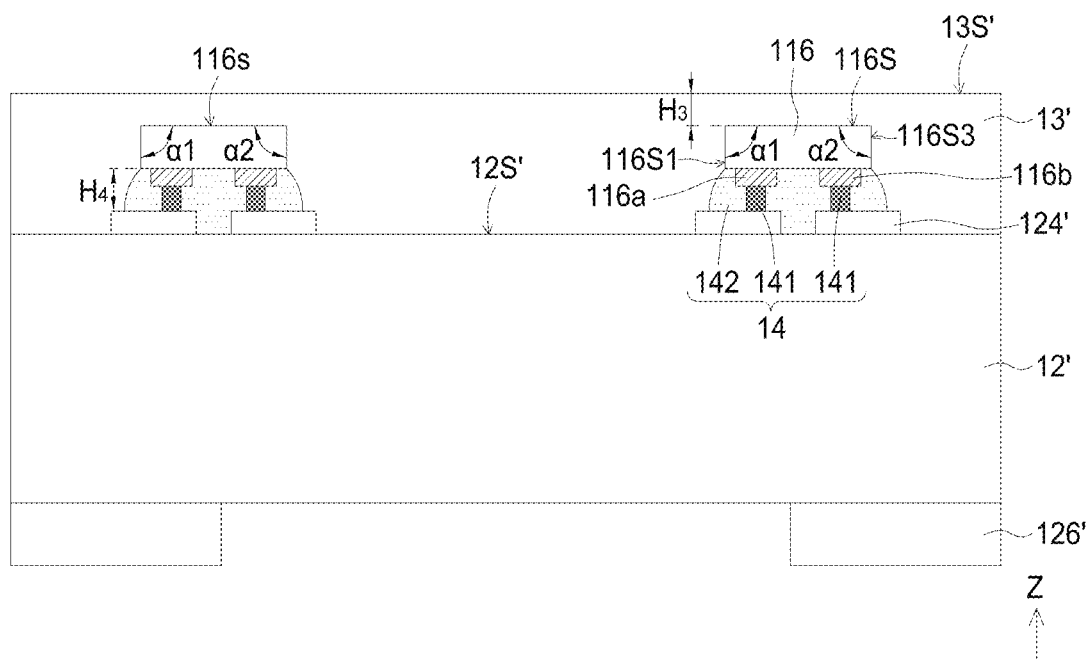
FIG. 12B is a cross-sectional schematic diagram of a light-emitting device 4 in FIG. 12A in accordance with an embodiment.

FIG. 12A shows a top view of a light-emitting device 4, and FIG. 12B is a cross-sectional schematic diagram of a light-emitting device 4 along the line EE' in FIG. 12A. As shown in FIG. 12B, the light-emitting device 4 includes a circuit carrier board 12', the light-emitting units 112, 114, and 116 of the light-emitting element group 11, and a light-transmitting element 13', wherein the light-emitting units 112, 114, and 116 are fixed on an upper electrode 124' on the circuit carrier board 12' by a conductive glue 14, and the light-transmitting element 13' covers the light-emitting units 112, 114, and 116 of the light-emitting element group 11 and a surface 12S' of the circuit carrier board 12', where the functions, structures, and materials of the circuit carrier board 12', the conductive glue 14, and the light-transmitting element 13' are the same as the circuit carrier board 12, the conductive glue 14, and the light-transmitting element 13 of the light-emitting device 1 mentioned above, respectively.

As shown in FIG. 12B, in an embodiment, the light-transmitting element 13' has an upper surface 13S' that is parallel to the surface 12S' of the circuit carrier board 12'. That is, the light-transmitting element 13' has a constant thickness on the surface of the circuit carrier board 12'. The thickness H3 between the upper surface 13S' of the light-transmitting element 13' and the upper surface 116S of the light-emitting unit 116 is between 1 µm and 500 µm. In an embodiment, the thickness H3 is between 50 µm and 150 µm, the maximum light-emitting intensities of the light-emitting units 112, 114, and 116 are between −10 degrees and 10 degrees in polar coordinates, and the light patterns are approximately an ellipse.

In an embodiment, the side surfaces of the light-emitting units 112, 114, and 116 have no oblique cracks or are more vertical face the short sides 2a' and 2c' of the target carrier board 2' in the display module 2000. As shown in FIG. 12B, taking the light-emitting unit 116 as an example, the side surfaces 116S1 and 116S3 have no oblique cracks or are more vertical face the short side edges 2a' and 2c'. The angle cu between the side surface 116S1 and the upper surface 116S and the angle $\alpha_3$ between the side surface 116S3 and the upper surface 116S are between 85 and 95 degrees. The maximum light-emitting intensities of the light-emitting units 112, 114 and 116 are between −10 degrees and 10 degrees, and the light patterns are approximately an ellipse.

In an embodiment, as shown in FIG. 12B, taking the light-emitting unit 116 as an example, the thickness H4 of the conductive glue 14 is within 5 µm, and the surface 116S of the light-emitting unit 116 keeps parallel or approximately parallel with the surface 12S' of the circuit carrier during the process and after the process. In the polar coordinates, the maximum light-emitting intensity of the light pattern of the light-emitting unit 116 is between −10 degrees and 10 degrees, and the light pattern is approximately an ellipse.

Figure 13A:
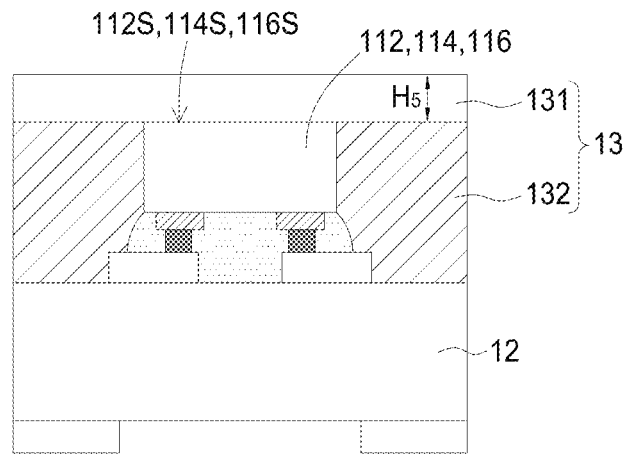
FIGS. 13A and 13B show cross-sectional schematic diagrams of a light-emitting device 1a and a light-emitting device 4a in accordance with an embodiment.
Figure 13B:
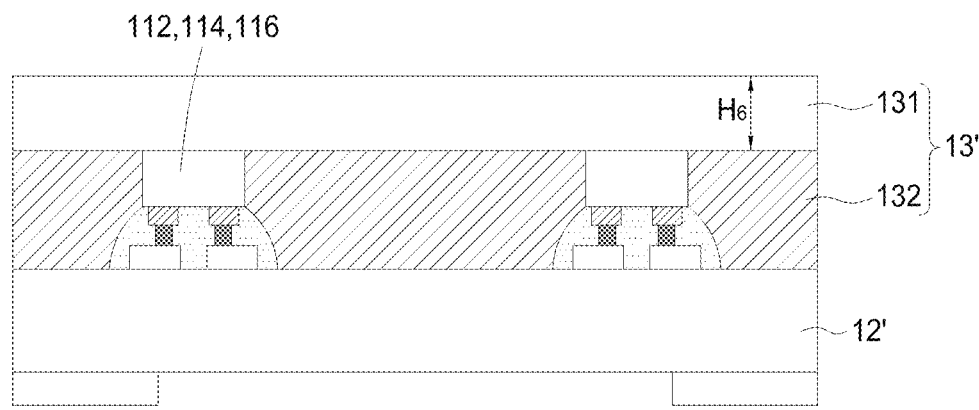

FIGS. 13A and 13B show cross-sectional structures of a light-emitting device 1a and a light-emitting device 4a according to an embodiment. The difference between the light-emitting device 1a and the light-emitting device 1 is that the light-transmitting element 13 includes a light-absorbing layer 132 and a light-transmitting layer 131 on the light-absorbing layer 132, wherein the light-absorbing layer 132 covers all or part of the side surfaces of the light-emitting units 112, 114, 116, and the upper surfaces 112S, 114S, 116S are exposed. The light-transmitting layer 131 is in direct contact with the light-absorbing layer 132 and the upper surfaces 112S, 114S, and 116S. The light absorbing layer 132 makes all or most of the lights emitted by the light-emitting units 112, 114, and 116 to exit from the upper surfaces 112S, 114S, and 116S. In addition, in an embodiment, the thicknesses H5 of the light-transmitting layer 131 on the upper surfaces 112S, 114S, and 116S are between 50 µm and 150 µm. In the polar diagram, the maximum light-emitting intensities the light patterns of the light-emitting units 112, 114, and 116 are between −10 degrees and 10 degrees, and the light patterns approximates an ellipse. The light-transmitting element 13' of the light-emitting device 4a has the same structure and function as the light-transmitting element 13 of the light-emitting device 1a.

What is claimed is:

1. A light-emitting device, comprising:
   a circuit carrier board having a short side and a long side, wherein the short side is shorter than the long side;
   a plurality of light-emitting units on the circuit carrier board for emitting three or more color lights, wherein the plurality of light-emitting units comprises a first light-emitting unit, and wherein maximum light-emitting intensities of the plurality of light-emitting units are at positions of 0±10 degrees in polar coordinates; and
   a light-transmitting glue layer on the circuit carrier board and covering the plurality of light-emitting units,
   wherein the first light-emitting unit has a light exit surface, a first sidewall, and a second sidewall, wherein the first sidewall faces the short side and has a first included angle with the light exit surface, and the second sidewall faces the long side and has a second included angle with the light exit surface, and wherein the first included angle is between 85 and 95 degrees, and the second included angle is less than 85 degrees or greater than 105 degrees.

2. The light-emitting device as claimed in claim 1, wherein the light-transmitting glue layer comprises silicone, epoxy resin, acrylic resin, or glass.

3. The light-emitting device as claimed in claim 1, wherein the light-transmitting glue layer has greater than 80% transmittance for wavelengths from 440 nm to 470 nm, 510 nm to 540 nm, and 610 nm to 640 nm.

4. The light-emitting device as claimed in claim 1, wherein a horizontal distance between two adjacent first light-emitting units of the plurality of light-emitting units and a vertical distance between the two adjacent first light-emitting units are the same.

5. The light-emitting device as claimed in claim 1, wherein the first light-emitting unit is a flip-chip, and the first light-emitting unit comprises a semiconductor stack and a sapphire substrate above the semiconductor stack.

6. The light-emitting device as claimed in claim 5, wherein an included angle between a side surface and an upper surface of the sapphire substrate is between 85 and 95 degrees.

7. The light-emitting device as claimed in claim 1, wherein a thickness of the light-transmitting glue layer between an upper surface of the light-transmitting glue layer and an upper surface of the first light-emitting unit is between 1 μm and 500 μm.

8. The light-emitting device as claimed in claim 7, wherein the thickness is between 50 μm and 150 μm.

9. A display device, comprising:
  a substrate; and
  a plurality of light-emitting devices as claimed in claim 1 fixed on the substrate in a form of an array.

10. The display device as claimed in claim 9, wherein the three or more color lights comprise red light, blue light, and green light.

11. The display device as claimed in claim 9, wherein a spacing distance between two adjacent light-emitting devices is between 5 μm and 1000 μm.

12. The light-emitting device as claimed in claim 1, wherein the circuit carrier board comprises an upper electrode.

13. The light-emitting device as claimed in claim 12, wherein the first light-emitting unit comprises an electrode facing and electrically connected to the upper electrode.

14. The light-emitting device as claimed in claim 13, further comprising a light-absorbing glue layer between the light-transmitting glue layer and the circuit carrier board.

15. The light-emitting device as claimed in claim 14, wherein the first light-emitting unit has a plurality of sidewalls, and the light-absorbing glue layer covers the plurality of sidewalls.

16. The light-emitting device as claimed in claim 13, further comprising a conductive glue layer between the electrode and the upper electrode, and electrically connected to the electrode and the upper electrode.

17. The light-emitting device as claimed in claim 16, wherein a thickness of the conductive glue layer between the electrode and the upper electrode is less than 5 μm.

18. The light-emitting device as claimed in claim 16, wherein the conductive glue layer comprises an insulating portion and a plurality of conductive portions, and the insulating portion surrounds the plurality of conductive portions.

19. The light-emitting device as claimed in claim 18, wherein the insulating portion comprises silicone, epoxy resin, or a mixture thereof, and the plurality of conductive portions comprise metal.

* * * * *